(12) United States Patent
Khan et al.

(10) Patent No.: US 10,825,821 B2
(45) Date of Patent: Nov. 3, 2020

(54) COOLING AND POWER DELIVERY FOR A WAFER LEVEL COMPUTING BOARD

(71) Applicant: International Business Machines Corporation, Armonk, NY (US)

(72) Inventors: Babar A. Khan, Ossining, NY (US); Arvind Kumar, Chappaqua, NY (US); Kamal K. Sikka, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 401 days.

(21) Appl. No.: 14/973,928

(22) Filed: Dec. 18, 2015

(65) Prior Publication Data

US 2017/0178986 A1   Jun. 22, 2017

(51) Int. Cl.
| | |
|---|---|
| H01L 27/11 | (2006.01) |
| H01L 23/36 | (2006.01) |
| H01L 23/522 | (2006.01) |
| H01L 23/32 | (2006.01) |
| H01L 23/00 | (2006.01) |

(52) U.S. Cl.
CPC .............. *H01L 27/11* (2013.01); *H01L 23/00* (2013.01); *H01L 23/32* (2013.01); *H01L 23/36* (2013.01); *H01L 23/522* (2013.01); *H01L 24/00* (2013.01)

(58) Field of Classification Search
CPC ... H01L 23/142; H01L 27/108; H01L 23/367; H01L 23/50; H01L 27/11; G01R 1/0491
See application file for complete search history.

(56) References Cited

U.S. PATENT DOCUMENTS

| 3,949,274 A | | 4/1976 | Anacker | |
|---|---|---|---|---|
| 5,223,741 A | * | 6/1993 | Bechtel | H01L 23/057 257/678 |
| 5,570,032 A | * | 10/1996 | Atkins | G01R 31/2862 324/750.06 |
| 5,682,064 A | * | 10/1997 | Atkins | G01R 1/07314 257/701 |

(Continued)

FOREIGN PATENT DOCUMENTS

| JP | 60254757 A | 12/1985 |
|---|---|---|
| JP | 4172302 A | 10/2004 |
| JP | 2015056462 A | 3/2015 |

OTHER PUBLICATIONS

Parades et al., Wafer-Level Integration of Embedded Cooling Approaches, Electrochemical Society Invited Abstracts, retrieved from : http://ma.ecsdl.org/content/MA2014-02/34/1738.abstract, 2 pages.

*Primary Examiner* — Hoang-Quan Ho
(74) *Attorney, Agent, or Firm* — Cantor Colburn LLP; Steven Meyers

(57) ABSTRACT

A computing device includes a wafer having multiple layers, the wafer including a top layer and sublayers disposed below it, the sublayers including one or more memory devices. The computing device also includes two or more shaped retainer elements shaped to mate with and at least partially surround at least the top of the wafer and in electrical contact with one or more chips disposed on a top of the top layer and a holding device that mates with the retainer elements to provide at least power to the retaining elements. So arranged, the wafer may be cooled.

4 Claims, 11 Drawing Sheets

(56) References Cited

U.S. PATENT DOCUMENTS

| | | | |
|---|---|---|---|
| 5,714,802 A * | 2/1998 | Cloud | H01L 25/0657 257/723 |
| 6,379,191 B1 | 4/2002 | Goetz | |
| 7,078,803 B2 | 7/2006 | Tilton | |
| 7,371,076 B2 | 5/2008 | Yen | |
| 8,097,943 B2 | 1/2012 | Badakere | |
| 8,961,193 B2 | 2/2015 | Chawla | |
| 2004/0207049 A1 | 10/2004 | Bauer | |
| 2013/0341803 A1* | 12/2013 | Cheah | H01L 24/05 257/774 |
| 2014/0162474 A1 | 6/2014 | Chawla | |
| 2016/0260687 A1* | 9/2016 | Gao | H01L 23/367 |

\* cited by examiner

COOLING AND POWER DELIVERY FOR A WAFER LEVEL COMPUTING BOARD

BACKGROUND

This invention generally relates to stacked, multi-wafer structures, and, in particular, to communication of information to and from such structures and providing power to them.

Huge quantities of data are being generated in the world in unconventional and unstructured formats (texts, video, images, sentiment, etc.). Making useful sense of these data requires new cognitive computing techniques similar to the way the human brain processes information.

These techniques, which require very high memory and communication bandwidths, reach fundamental limitations in a conventional von Neumann architecture, which suffers from a bottleneck between a separated CPU and memory.

SUMMARY

Disclosed is a computing device that includes a wafer having multiple layers, the wafer including a top layer and sublayers disposed below it, the sublayers including one or more memory devices. The computing device also includes two or more shaped retainer elements shaped to mate with and at least partially surround at least the top of the wafer and in electrical contact with one or more chips disposed on a top of the top layer and a holding device that mates with the retainer elements to provide power to the retaining elements.

Also disclosed is a computing device that includes a wafer having multiple layers, the wafer including a top layer and sublayers disposed above it, the sublayers including one or more memory devices. The device also includes a holding device that mates with the wafer elements to provide at least power to the retaining elements, the holding device including wire springs that contact either the top layer or a bottom layer of the wafer.

BRIEF DESCRIPTION OF THE DRAWINGS

Referring to the exemplary drawings wherein like elements are numbered alike in the several Figures.

DETAILED DESCRIPTION

Embodiments of the invention provide a construct that allows for power/data communication with a cortical system. Additionally the embodiments provide cooling schemes to draw power away from the cortical system.

A cortical system may alleviate the CPU memory bandwidth problem of conventional computer architectures by transferring much of the memory intensive processing to a battalion of Simple Specialized Processors (SSPs) which are embedded in a large sea of computer memory. These SSPs carry out operations on their domains and then transmit very high level results to a number of General Management Processors (GMPs). The burden of the memory and communications bandwidth is therefore transferred largely to the SSPs. Since the SSPs report very high level results to the GMPs, the bandwidth required for the SSP-to-GMP communication is manageable. A more detailed description of how a cortical system may be formed may be found in U.S. patent application Ser. No. 14/713,689, which is incorporated herein by reference.

Figure 1:
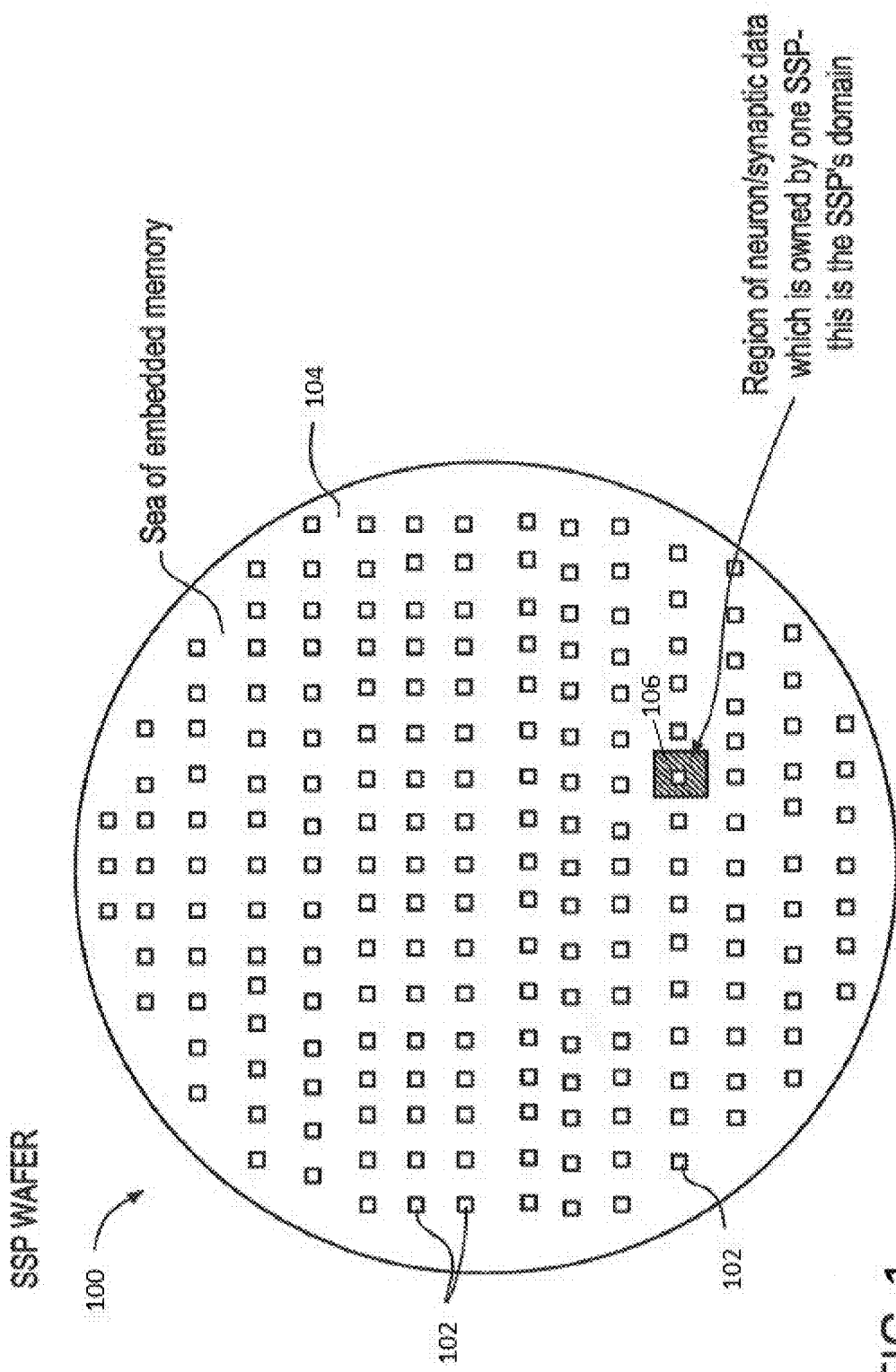
FIG. 1 illustrates an SSP according to one embodiment.

FIG. 1 shows an SSP wafer 100. In this wafer, a battalion of simple specialized processors (SSPs) 102 are embedded in a large sea of computer memory 104. Memory 104 may comprise any suitable amount and type of memory. For example, the embedded memory, may be in the range of 30-300 GB per wafer, and, in embodiments of the invention, may be embedded DRAM, DRAM, or SRAM.

Each SSP is associated with a memory domain, one of which is shown at 106. The SSPs carry out operations on their domains 106 and then transmit very high level results to a small number of General Management Processors (GMPs). The SSPs may number between approximately 100-1000 per wafer. Each SSP is a specialized simple microprocessor to execute certain memory primitives for memory in its vicinity (domain). The SSPs are referred to as specialized because they are used for a limited number of functions. Any suitable processor may be used in embodiments of the invention as an SSP, and suitable processors are known in the art.

Examples of SSP jobs include: find largest or smallest element in domain; multiply matrix or vector by constant; matrix-matrix, matrix-vector, vector-vector products; fill the domain with random numbers. The SSP also has router/buffer capabilities, discussed below. Each memory domain is a region of neuron/synaptic data which is owned by one SSP—this is the SSP's domain.

Figure 2:
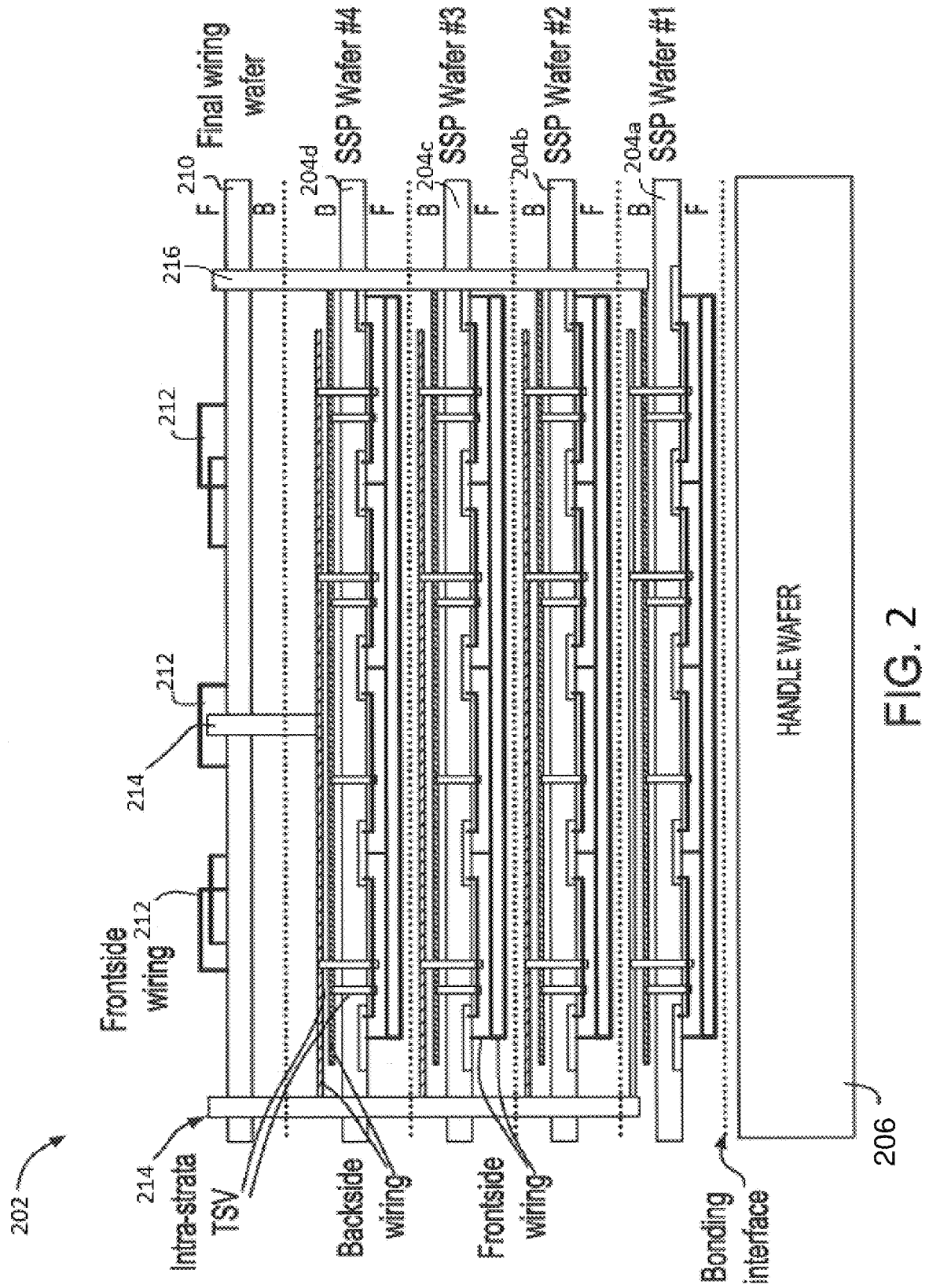
FIG. 2 shows an example of stacked SPP wafers.

FIG. 2 shows a stack 202 of wafers in accordance with an embodiment of the invention. This stack comprises four SSP wafers 204a-204d, of the type shown in FIG. 1 on top of a handle wafer 206 and a top wiring wafer 210. In this embodiment, the top wafer 210 is mounted on top of the SSP wafer stack and is bonded to that stack, and the GMPs 212 and other high level chips are bonded by flip chip bonding to the wiring-level wafer. The bottom SSP wafer 204a is bonded to the handle wafer 206 via a bonding interface.

Frontside wiring 212 on the final wiring wafer 210 is used, for example, to provide GMP-to-GMP communications. Communications between the GMP chips and the underlying SSPs can be done through a communication channel with only medium bandwidth capabilities such as a layer of micro C4s due to the modest bandwidth requirements, as discussed above. Inter-strata TSVs are used, for instance, for communication from GMP level to SSP level, and for connections to power and ground within the stack.

As illustrated, interlayer connections 214 may be used to allow data to be transferred between SSP wafers and between the SSP wafers and the top wiring wafer 210. Also illustrated is a power bus 216 that provides for the transmission of power to all wafers 204 and 210. The interconnectivity between layers is shown by example only in FIG. 2. Of course, other configurations are possible.

In the stack of FIG. 2, adjacent SSP wafers are placed back-to-front—that is, the backside of one of the adjacent wafers faces the front side of the other of the adjacent wafers. Backside wiring on the SSP wafer may be used, for example, to provide power and ground the wafer. Frontside wiring 212 on the final SSP wafer 210 may be used, for instance, for SSP-SSP communication from an external location to the wafers.

The above-described wiring scheme is general, and many other suitable schemes may be used in embodiments of the invention. Also, for instance, in embodiments of the invention, backside wiring is optional, and power/ground can also be distributed on the front. Below, systems and methods for providing power/data from an external location to the wafer stack 202 are discussed.

The stack in FIG. 2 comprises four SSP wafers. It may be noted that the stack can be general to N SSP wafers, and have more or fewer SSP wafers than is shown in FIG. 2.

Figure 3:
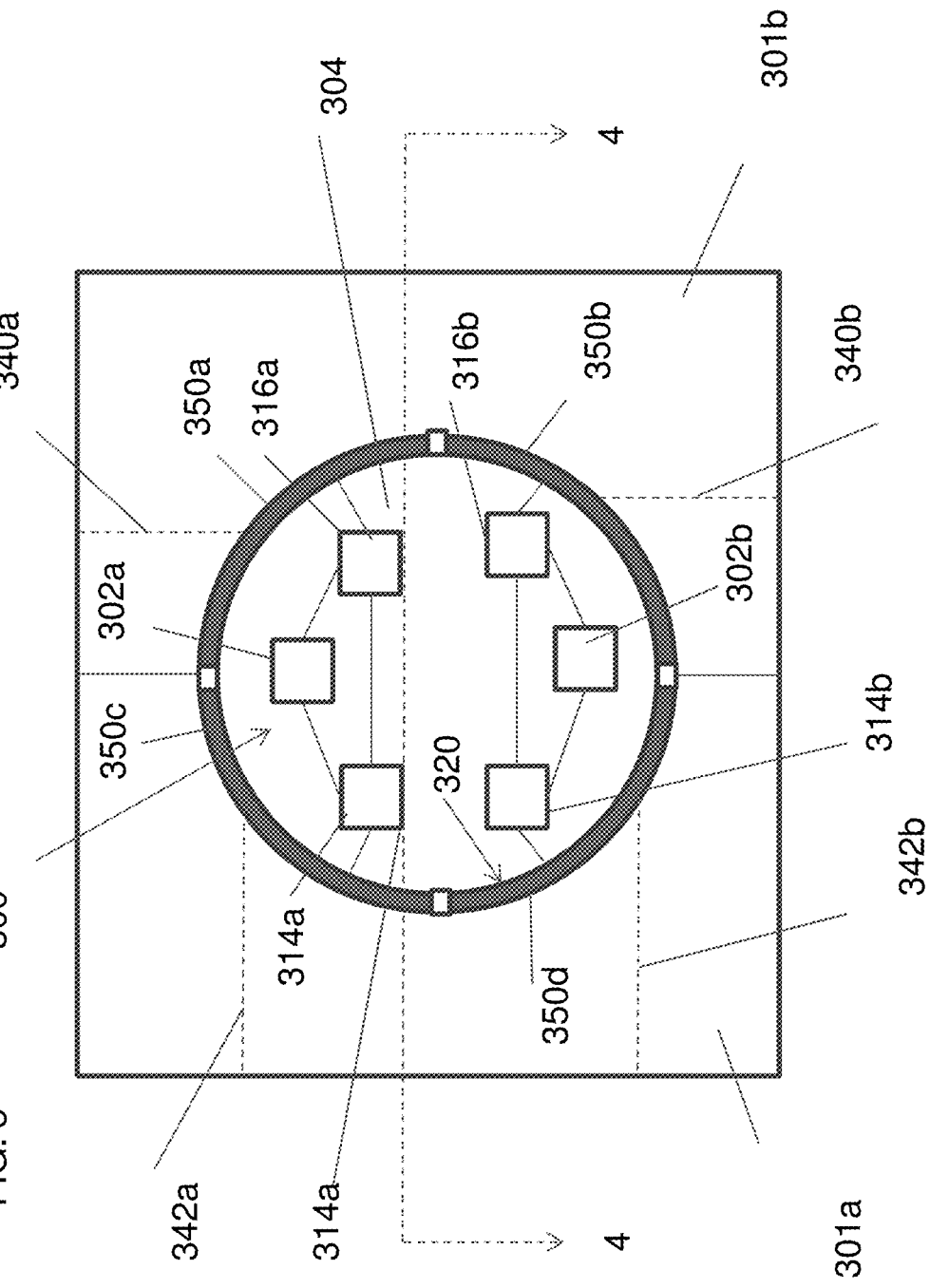
FIG. 3 shows a top view of a wafer stack held by two holding elements.

FIG. 3 shows a top view of a wafer 300 contained in a two-part retaining element 301. It shall be understood that the wafer 300 can include several layers as described above and, as such, may also be referred to as a wafer stack herein.

The two part retaining element 301 includes retainer halves 301a and 301b and allows for power to be provided to the wafer 300. It may also allow for data to be transferred to or from the wafer 300.

In this embodiment, the wafer 300 includes 2 GMPS 302. This number is purely by way of example and is in no way limited. The GMPs 302 may be bonded on a wiring wafer 304. FIG. 3 also shows power supplies 314 and I/O connections 316. As illustrated, Each GMP 302a, 302b is independent and includes has own respective power supply 314a, 314b and I/O connections 316a, 316b. In another embodiment, one of the GMPs may be selected as the lead GMP, and the other GMP(s) are referred to as subordinate GMPs. In embodiments of the invention, memory chips bonded to the wiring wafer are optional and can be dedicate to an individual GMP 302 or shared between two or more GMPs or a combination of both. Any suitable memory chips or devices may be used in embodiments of the invention; and, for example, memory chips may be DRAMs or other suitable memory chips in the range of 4-128 GB.

The GMPs 302 may be high performance processors. Any suitable processor may be used as a GMP, and suitable processors are known in the art. The GMPs communicate with external I/O connections 316. The GMP's may also receive power from a power supply 314. The power supplies may also provide power directly to the I/O connections 316 (as illustrated) or such power may be provided through the GMP's 302. One of ordinary skill will realize that any number of additional of GMP's, I/O connections, or any other kind of chip may be provided on the wiring wafer 304.

As illustrated, the two part retaining element 301 includes retainer halves 301a and 301b. These retainer halves may be forced together to contact and surround outer edges of the wafer 300. The outer edges are shown as element 320 in FIG. 3.

The retainer halves 301a and 301b are shaped such that when brought together they will contact the outer edges 320 of the wafer stack 300. The retainer halves 301a, 301b include one or more curvilinear connectors 350 shaped to mate with the outer edge 320. As illustrated the retainer halves 301a, 301b include 4 separate connectors 350 labelled as 350a, 350b (contained in retainer half 301b) and 350c, 350d (contained in retainer half 301a) Of course the number of connectors may vary and be only one in one embodiment and can include any other number. The connectors allow power or data to be carried from or to an external location. For example, connectors 350c and 350d may be power connectors that receive power from external power lines 342a and 342b, respectively. The external power lines 342a, 342b may connect to another source of power off of wafer 300.

Similarly, connectors 350a and 350b may be data connectors that provide data to I/O connections 316a and 316b, respectively. The data may be received from or delivered to external data line 340a, 340b so that the wafer can transfer data to other wafers. The power lines and data lines can be on the surface of the wafer or between layers and, as such, are shown in dashed form.

In the above description the connectors 350 where described are part of retainer halves 301a and 301b. It shall be understood that in another embodiment, the connectors 350 could be attached to the wafer 300 first, and then inserted between the retainer halves 301a, 301b. The retainer halves 301a, 301b could then be brought together to contact and hold the assembly including the connectors and the wafer 300. The retainer halves 301 may form a holding device in one embodiment.

Figure 4:
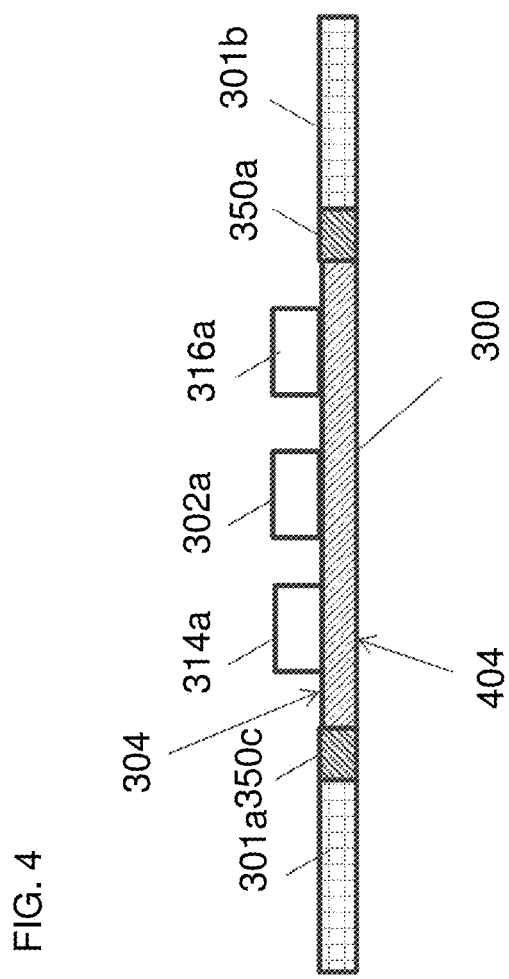
FIG. 4 shows a cross-sectional view of FIG. 3 taken along lines 4-4.

FIG. 4 shows a block diagram of a cross-section of the embodiment shown in FIG. 3 taken along line 4-4. The wafer 300 has connectors 350c and 350a coupled to opposing sides thereof. The connectors 350c and 350a could initially be connected and part of retainer halves 301a, 301b or could be connected directly to the wafer 300 and then held by the retainer halves 301a, 301b. In this embodiment, the connectors 350 are flush or nearly flush with the top 304 and bottom 404 of the wafer 300.

Figure 5:
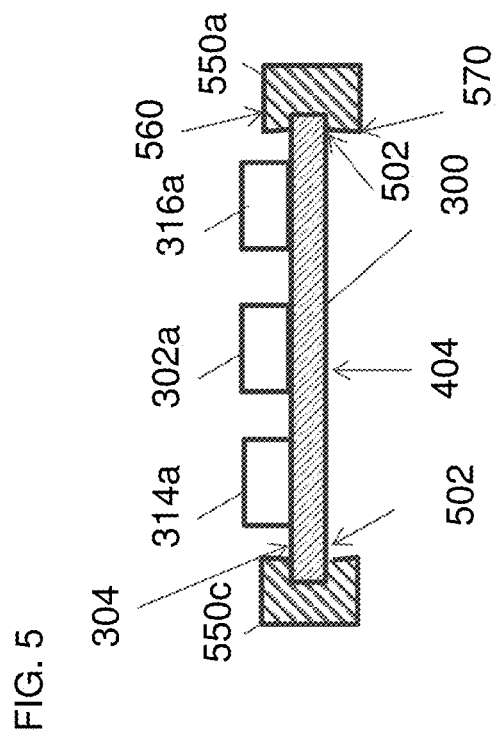
FIG. 5 shows one configuration where the connectors include a groove into which the wafer may be inserted.

FIG. 5 shows an example of another embodiment where the connectors 550c, 550a (or any other connector) includes a groove 502 into which the wafer 300 may be inserted. In this embodiment, the connectors 550c, 550a have at least a top extension 560 or a bottom extension 570 (or both) that, respectively, covers at least a portion of the top 304 or the bottom 404 of the wafer stack. Such extensions may allow for the wafer 300 to be retained in the same manner as described above (e.g., by retaining halves 301a and 301b) or by a bottom mounted system.

Figure 6:
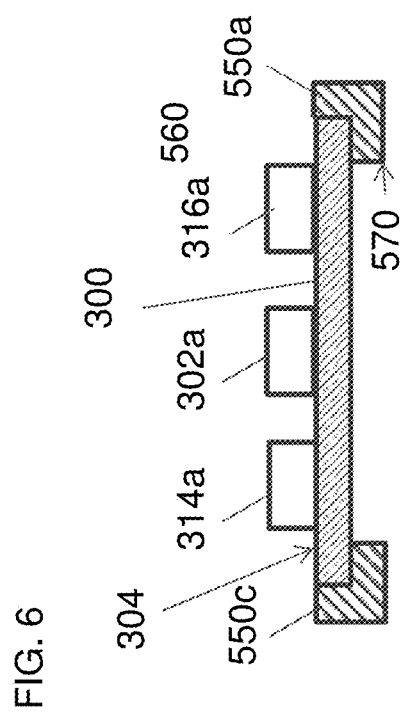
FIG. 6 shows alternative connector embodiment to that shown in FIG. 5.

FIG. 6 shows an example of a bottom mounted system 600 that holds a wafer 300. The wafer 300 (or wafer stack) includes connectors 550a, 550c that include bottom extensions 570. Of course, the connectors could also include top extensions or no extension in one embodiment.

Figure 7:
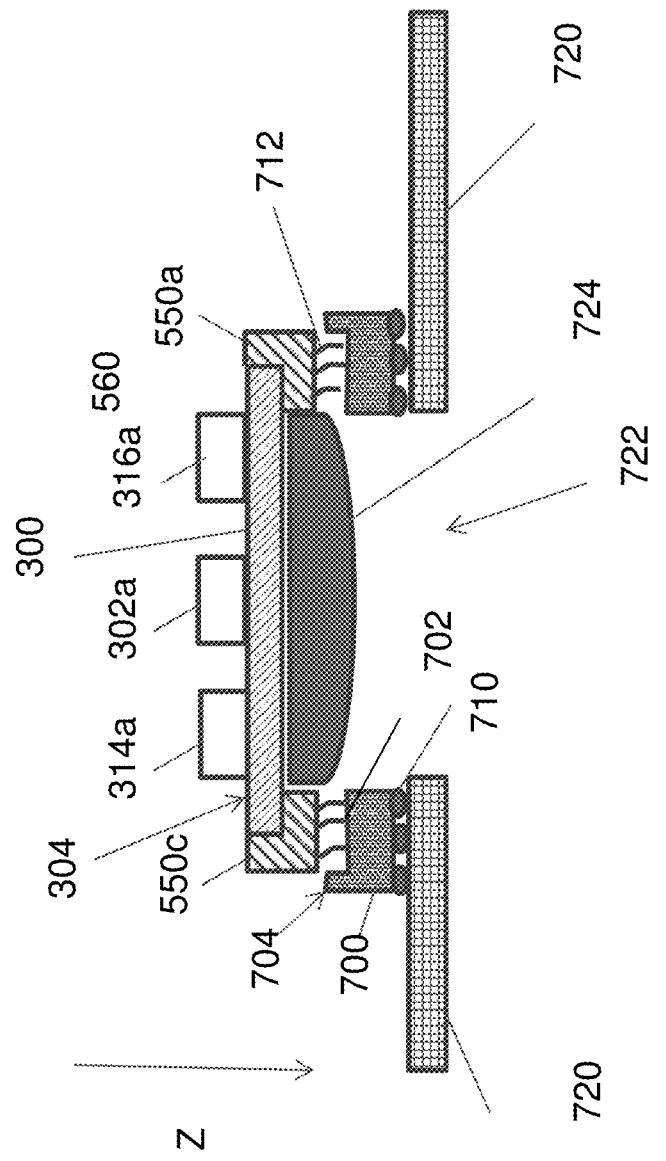
FIG. 7 shows a cross-section of a wafer attached to a board according to one embodiment.

The wafer of FIG. 6 may be inserted into and held in various manners. For example, with reference now to FIG. 7, the wafer 300 including one or more connectors 550 may be inserted into a open-bottomed socket 700. The socket (holding device) includes a seat 702 and outer edges 704. The socket 700 receives power or data from a circuit board or laminate 720 via connections 710 (e.g., solder bumps) in one embodiment but other means for providing power/data to the socket 700 could be utilized. The socket also includes one or more springs 712 through which power or data can be communicated with the wafer. The springs 712 may be formed or a deformable metal and may be referred to as wires herein.

Figure 11:
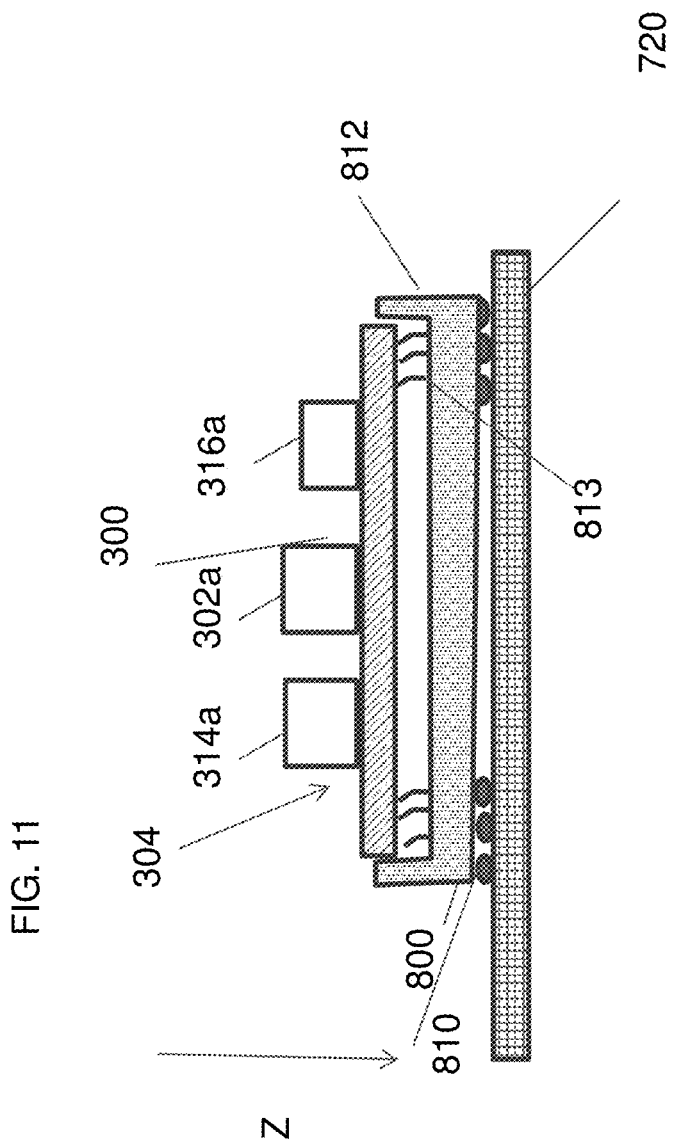
FIG. 11 shows a cross section of a wafer attached to a board according to another embodiment.

As illustrated, the wafer includes connectors 550 coupled to it outer edges. These connectors could be omitted in one embodiment. For example, if omitted, the wafer could be flipped over and placed face down such that the power/data access locations on the upper surface 304 may contact the springs 712. Of course, the power/data access locations could be location on an underside of the wafer 300 instead and, in such a case, the wafer 300 need not be flipped over. Such is shown in FIG. 11. (why not renumber the figures to have FIG. 11 as FIG. 8 instead of a non-sequential order of figures?)—This comment can be removed.

Most wafer level packaging approaches involve attaching the chips to wafers, and then dicing the larger wafers to create 2-high stack chip-on-chip structures that can then be attached to chip-carrier substrates and then packaged in a similar manner to conventional 2D packages. Power delivery is achieved through the bottom chip with through silicon vias to the top chip. Cooling of such structures is then achieved by a TIM inserted between the top chip and a lid attached to the chip-carrier substrate. The bottom chip in the stack has a thermal penalty compared to a 2D chip since the heat dissipated in the bottom chip has to conduct through the top chip and the chip-chip interconnects.

To provide for cooling, in one in one embodiment, the board 720 includes a hole 722 that allows for air to flow to an underside of the wafer. In one embodiment, a heat sink 724 may be attached to the wafer on its underside. The heat sink can be attached to the top of the wafer, the bottom of the wafer or both. Further, referring again to FIG. 3, such a configuration will also allow for heat sinks to be placed on the top/bottom due to its open nature. The wafer 300 may be inserted into the socket 700 in direction Z.

Figure 8:
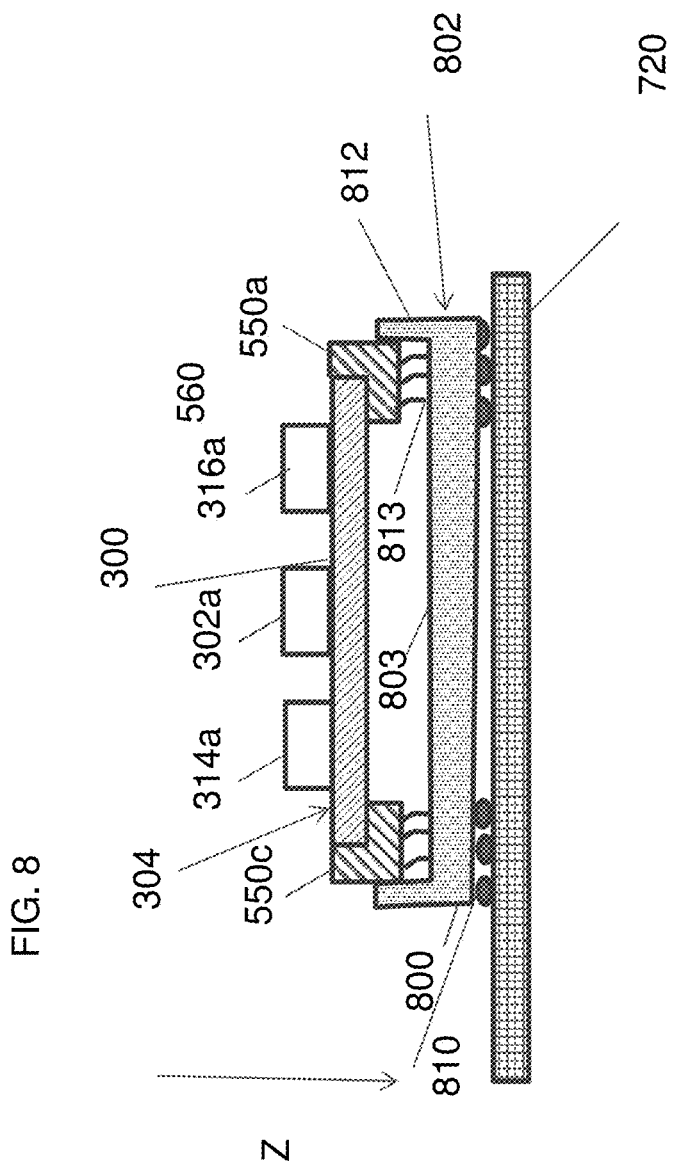
FIG. 8 shows a cross section of a wafer attached to a board according to another embodiment.

FIG. 8 shows an alternative embodiment. In this embodiment, a circuit board 800 includes a full socket 802 coupled thereto. The full (holding device) includes a seat 803 and outer edges 812. The socket 802 receives power or date from a circuit board or laminate 720 via connections 810 (e.g., solder bumps) in one embodiment but other means for providing power/data to the socket 802 could be utilized. The socket also includes one or more springs 813 through which power or data can be communicated with the wafer. As illustrated, the wafer includes connectors 550 coupled to it outer edges. These connectors could be omitted in one embodiment. For example, if omitted, the wafer could be flipped over and placed face down such that the power/data access locations on the upper surface 304 may contact the springs 813. Of course, the power/data access locations could be location on an underside of the wafer 300 instead and, in such a case, the wafer 300 need not be flipped over. The wafer 300 may be inserted into the socket 800 in direction Z.

Figure 9:
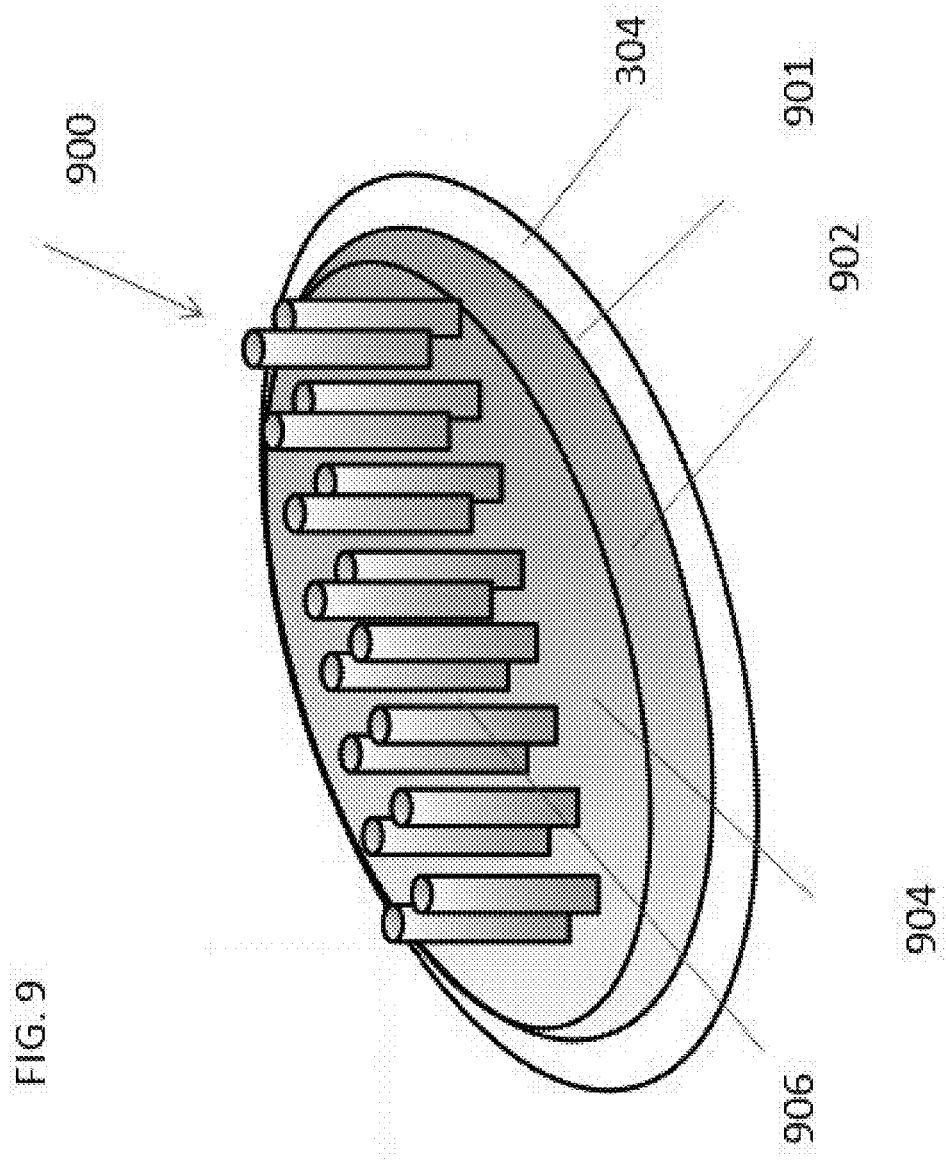
FIG. 9 shows an example of a pin-fin heat sink.

An example of a heat sink 900 that may be used is shown in FIG. 9. It shall also be understood that another heat sink may be placed on a bottom wafer 300. The heat sink in FIG. 9 includes a base 901 from which a sidewall 902 extends upwardly to a top layer 904. The sidewall may be sized and arranged such that it creates a hollow region under the top layer 904 so that chips on the top of the wafer may fit under and be in thermal contact with the heat sink 900. As illustrated, the heat sink 900 includes a plurality of optional pin fins 906. Fins of other shapes can also be used.

Figure 10:
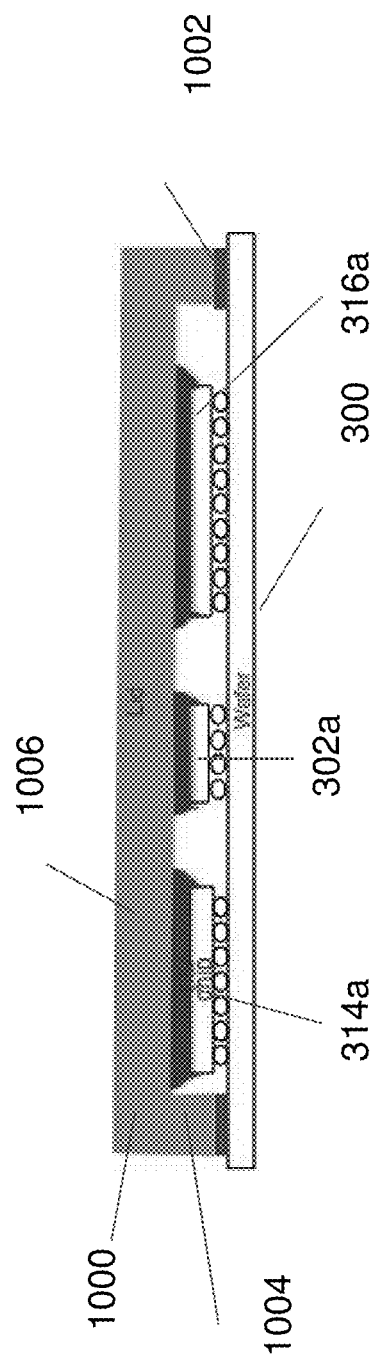
FIG. 10 shows a side view of a lidded wafer.

FIG. 10 shows an example of a heat sink 1000 disposed on top of a wafer 300 that includes chips 302a, 314a and 316a connected to a top side thereof. An adhesive 1002 may hold the sidewalls 1004 to the wafer 300. In addition, heat transferring material may be disposed between the chips 302a, 314a and 316a and the tip 1006 of the heat sink. Such a material may include a glue in one embodiment, or polymers, epoxies or solders.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computing device including:
    a wafer having a top layer and a curved outer edge;
    two or more shaped retainer elements each shaped to mate with and at least partially surround at least the top of the wafer and in electrical contact with one or more chips disposed on a top of the top layer;
    a holding device that mates with the retainer elements to provide power to one of the retainer elements and data to another one of the retainer elements;
    wherein the retainer elements are curvilinear.

2. The device of claim 1, wherein the holding device includes two halves that are moved together to mate with the retainer elements.

3. The device of claim 2, wherein a heat sink is attached to the top of the wafer.

4. The device of claim 3, wherein a heat sink is attached to the bottom of the wafer.

* * * * *